United States Patent
Shabbir et al.

(10) Patent No.: US 10,678,313 B2
(45) Date of Patent: Jun. 9, 2020

(54) IMPEDANCE-BASED COOLING CONTROLS

(71) Applicant: Dell Products L.P., Round Rock, TX (US)

(72) Inventors: Hasnain Shabbir, Round Rock, TX (US); Dominick Lovicott, Jarrell, TX (US); Richard Mark Eiland, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 109 days.

(21) Appl. No.: 15/971,296

(22) Filed: May 4, 2018

(65) Prior Publication Data

US 2019/0339752 A1 Nov. 7, 2019

(51) Int. Cl.
*G05D 23/00* (2006.01)
*G06F 1/20* (2006.01)
*G05D 23/19* (2006.01)
*H05K 7/20* (2006.01)

(52) U.S. Cl.
CPC ......... *G06F 1/206* (2013.01); *G05D 23/1902* (2013.01); *G05D 23/1917* (2013.01); *H05K 7/20209* (2013.01)

(58) Field of Classification Search
CPC ..................................................... G06F 1/206
USPC ....................................................... 700/300
See application file for complete search history.

(56) References Cited

U.S. PATENT DOCUMENTS

| | | | | |
|---|---|---|---|---|
| 4,158,175 A | * | 6/1979 | Toyomaki | H03J 7/02 331/1 R |
| 7,379,297 B2 | * | 5/2008 | Peterson | G06F 1/206 361/690 |
| 8,174,826 B2 | * | 5/2012 | El-Essawy | G06F 1/18 165/104.33 |
| 8,393,917 B2 | * | 3/2013 | Regnier | H05K 7/20709 439/485 |
| 9,392,726 B2 | * | 7/2016 | Shelnutt | H05K 7/20145 |
| 9,618,986 B2 | * | 4/2017 | North | G06F 1/20 |
| 2012/0262298 A1 | * | 10/2012 | Bohm | A61B 5/1495 340/604 |
| 2016/0342181 A1 | * | 11/2016 | Peterson | G05B 15/02 |
| 2018/0321716 A1 | * | 11/2018 | Lien | G06F 1/20 |
| 2018/0359882 A1 | * | 12/2018 | Lovicott | H05K 7/20727 |
| 2019/0310666 A1 | * | 10/2019 | Mugunda | G05D 23/1917 |

* cited by examiner

*Primary Examiner* — Suresh Suryawanshi
(74) *Attorney, Agent, or Firm* — Jackson Walker L.L.P.

(57) ABSTRACT

An information handling system may include a processor, a memory, modules including one or more information handling resources and having a corresponding airflow impedance associated therewith, and a cooling system that includes a controller and of air movers. The controller may be configured to, in response to a determination that a first module of the plurality of modules has a first airflow impedance higher than an upper threshold impedance and that a second module of the plurality of modules has a second airflow impedance lower than a lower threshold impedance: determine a scaling factor based on the first and second airflow impedances, scaling factor being usable by the controller to adjust an amount of airflow provided by the plurality of air movers; and control the plurality of air movers in an open-loop fashion according to the scaling factor.

20 Claims, 4 Drawing Sheets

| Index | Description | Average Impedance | Highest Impedance | Lowest Impedance | Module Type A Scaling Factor ||||||| Module Type B Scaling Factor |
|---|---|---|---|---|---|---|---|---|---|---|---|
| | | | | | Tier 0 | Tier 1 | Tier 2 | Tier 3 | Tier 4 | Tier 5 | Tier 6 | |
| 1 | Default | ≥0 | ≥0 | ≥0 | 1.00 | 1.07 | 1.24 | 1.33 | 1.55 | 1.79 | 2.04 | 3.50 |
| 2 | All Tier 0 | 0 | 0 | 0 | 0.91 | N/A | N/A | N/A | N/A | N/A | N/A | 3.26 |
| 3 | All Tier 1 | 1 | 1 | 1 | N/A | 1.00 | N/A | N/A | N/A | N/A | N/A | 3.13 |
| 4 | All Tier 2 | 2 | 2 | 2 | N/A | N/A | 1.07 | N/A | N/A | N/A | N/A | 2.96 |
| 5 | All Tier 3 | 3 | 3 | 3 | N/A | N/A | N/A | 1.24 | N/A | N/A | N/A | 2.88 |
| 6 | All Tier 4 | 4 | 4 | 4 | N/A | N/A | N/A | N/A | 1.33 | N/A | N/A | 2.72 |
| 7 | All Tier 5 | 5 | 5 | 5 | N/A | N/A | N/A | N/A | N/A | 1.55 | N/A | 2.60 |
| 8 | All Tier 6 | 6 | 6 | 6 | N/A | N/A | N/A | N/A | N/A | N/A | 1.79 | 2.40 |
| 9 | Low (Tier 0-2) | 0-2 | ≤2 | ≥0 | 0.81 | 1.00 | 1.14 | N/A | N/A | N/A | N/A | 3.12 |
| 10 | Med (Tier 3-4) | 3-4 | ≤4 | ≥3 | N/A | N/A | N/A | 1.23 | 1.41 | N/A | N/A | 2.80 |
| 11 | High (Tier 5-6) | 5-6 | ≤6 | ≥5 | N/A | N/A | N/A | N/A | N/A | 1.50 | 1.86 | 2.51 |

FIG. 4

IMPEDANCE-BASED COOLING CONTROLS

TECHNICAL FIELD

The present disclosure relates in general to information handling systems, and more particularly to systems and methods for cooling of information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction, and damage leading to a shortened component lifespan. Accordingly, heatsinks and/or air movers (e.g., cooling fans and blowers) have often been used in information handling systems to cool information handling systems and their components.

Various challenges may arise in the cooling context based on the airflow impedances of information handling resources. Airflow impedance, typically defined as the ratio of pressure to airflow, describes how much resistance to flow a particular configuration of components (e.g., an expansion card, a physical storage resource such as a hard drive, or a module including multiple types of components) presents.

In particular, when devices with a shared airflow path have heterogeneous impedances, additional difficulties can arise. For example, when one or more air movers are providing airflow to several modules along a shared airflow path, an unequal distribution of that airflow typically results. Those modules with high impedance may not receive sufficient airflow, and those with low impedance may receive more airflow than necessary.

Existing solutions have sometimes relied on "worst-case" impedance calculations to ensure that even those modules with high airflow impedance receive sufficient airflow. This may be considered wasteful, however, in terms of the number of air movers required and the power consumed thereby. The additional power consumption of such air movers is of course an extra source of heat, further exacerbating the problem. Other existing solutions have sometimes relied on average impedances, but such solutions are also suboptimal because they fail to capture important characteristics of the system.

This disclosure thus provides improved techniques for cooling, such that the various airflow impedances of the modules that need to be cooled are taken into account without simply assuming a worst-case or average-case scenario. Techniques according to this disclosure may be particularly applicable in the open-loop control context, although they need not be so limited.

It should be noted that the discussion of a technique in the Background section of this disclosure does not constitute an admission of prior-art status. No such admissions are made herein, unless clearly and unambiguously identified as such.

SUMMARY

In accordance with the teachings of the present disclosure, the disadvantages and problems associated with cooling control may be reduced or eliminated.

In accordance with embodiments of the present disclosure, an information handling system may include a processor, a memory communicatively coupled to the processor, a plurality of modules installed in the information handling system, wherein each module includes one or more information handling resources, and wherein each module has a corresponding airflow impedance associated therewith, and a cooling system comprising a controller and a plurality of air movers. The controller may be configured to, in response to a determination that a first module of the plurality of modules has a first airflow impedance higher than an upper threshold impedance and that a second module of the plurality of modules has a second airflow impedance lower than a lower threshold impedance: determine a scaling factor based on the first and second airflow impedances, wherein the scaling factor is usable by the controller to adjust an amount of airflow provided by the plurality of air movers; and control the plurality of air movers in an open-loop fashion according to the scaling factor.

In accordance with these and other embodiments of the present disclosure, a method may include at an information handling system that includes a plurality of modules installed therein, each module including one or more information handling resources, and each module having a corresponding airflow impedance associated therewith, a controller of a cooling system determining that a first module has a first airflow impedance higher than an upper threshold impedance and that a second module has a second airflow impedance lower than a lower threshold impedance. The method may further include the controller determining a scaling factor based on the first and second airflow impedances, wherein the scaling factor is usable by the controller to adjust an amount of airflow provided by a plurality of air movers, and the controller controlling the plurality of air movers in an open-loop fashion according to the scaling factor.

In these and other embodiments of the present disclosure, an article of manufacture may include a non-transitory, computer-readable medium having instructions thereon that are executable by a controller of a cooling system of an information handling system. The instructions may be executable for: determining that a first module of the information handling system has a first airflow impedance higher than an upper threshold impedance and that a second module of the information handling system has a second airflow impedance lower than a lower threshold impedance; determining a scaling factor based on the first and second airflow impedances, wherein the scaling factor is usable to adjust an amount of airflow provided by a plurality of air movers of the information handling system; and controlling the plurality of air movers in an open-loop fashion according to the scaling factor.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 4 illustrates an example of a data table, in accordance with embodiments of the present disclosure.

DETAILED DESCRIPTION

Figure 1:
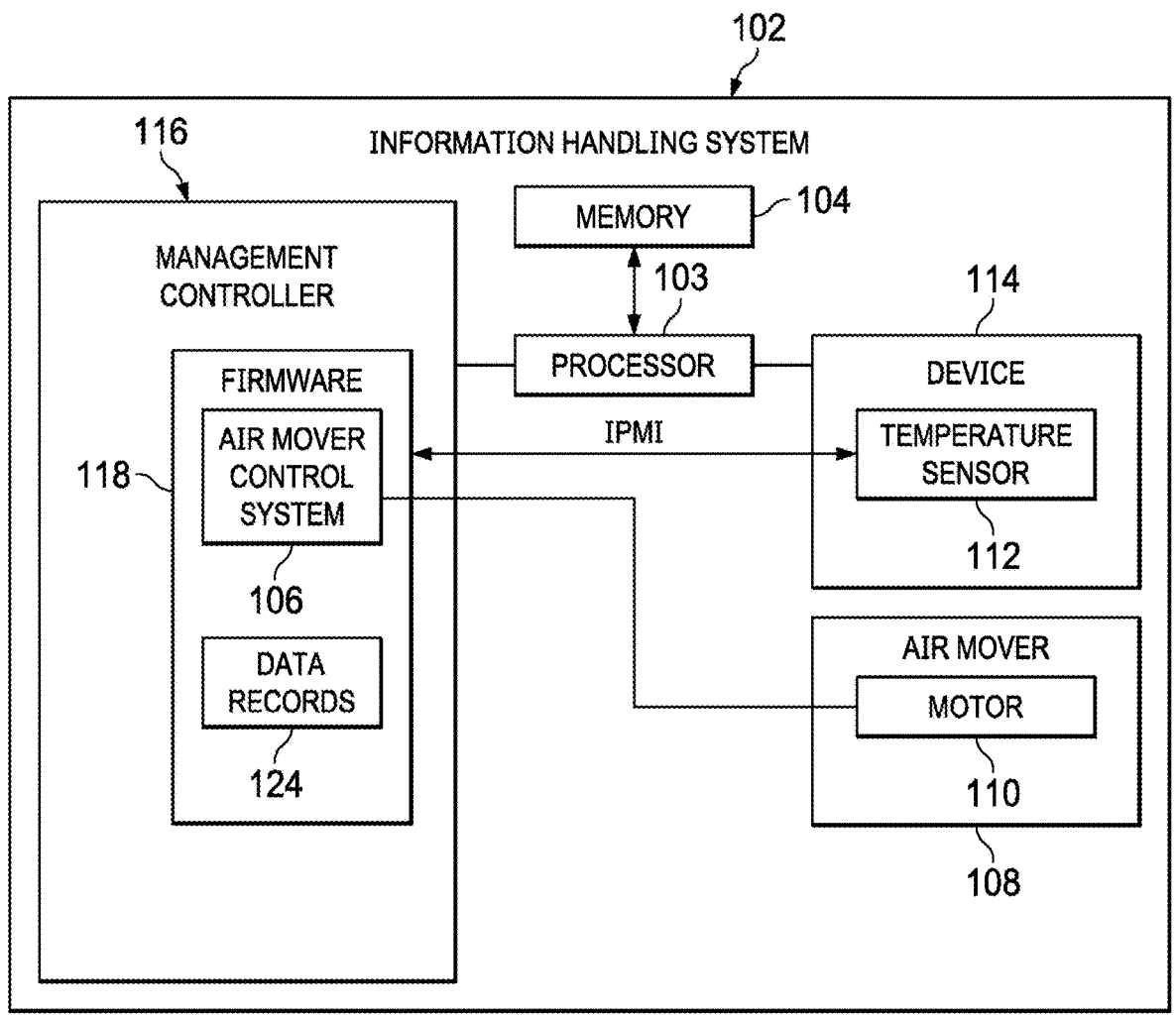
FIG. 1 illustrates a block diagram of an example information handling system, in accordance with embodiments of the present disclosure.

Preferred embodiments and their advantages are best understood by reference to FIGS. 1 through 4, wherein like numbers are used to indicate like and corresponding parts. For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For purposes of this disclosure, when two or more elements are referred to as "coupled" to one another, such term indicates that such two or more elements are in electronic communication or mechanical communication, as applicable, whether connected indirectly or directly, with or without intervening elements.

When two or more elements are referred to as "coupleable" to one another, such term indicates that they are capable of being coupled together.

For the purposes of this disclosure, computer-readable media (e.g., transitory or non-transitory computer-readable media) may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems, buses, memories, I/O devices and/or interfaces, storage resources, network interfaces, motherboards, and/or any other components and/or elements of an information handling system.

FIG. 1 illustrates a block diagram of an example information handling system 102, in accordance with the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data (which may generally be referred to as "physical storage resources" herein). As shown in FIG. 1, information handling system 102 may comprise a processor 103, a memory 104, one or more air movers 108, one or more devices 114, and a management controller 116.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may include any system, device, or apparatus configured to retain program instructions and/or data for a period of time (e.g., computer-readable media). Memory 104 may include RAM, EEPROM, a PCMCIA card, flash memory, magnetic storage, opto-magnetic storage, or any suitable selection and/or array of volatile or non-volatile memory that retains data after power to information handling system 102 is turned off.

Memory 104 may have stored thereon an operating system. Such an operating system may comprise any program of executable instructions, or aggregation of programs of executable instructions, configured to manage and/or control the allocation and usage of hardware resources such as memory, processor time, disk space, and input and output devices, and provide an interface between such hardware resources and application programs hosted by the operating system. In addition, the operating system may include all or a portion of a network stack for network communication via a network interface (e.g., one of devices 114 may be a network interface for communication over a data network). Although the operating system may be stored in memory 104, in some embodiments it may be stored in storage media accessible to processor 103, and active portions of the operating system may be transferred from such storage media to memory 104 for execution by processor 103.

Air mover 108 may be communicatively coupled to air mover control system 106 of management controller 116, and may include any mechanical or electro-mechanical system, apparatus, or device operable to move air and/or other gases. In some embodiments, air mover 108 may comprise a fan (e.g., a rotating arrangement of vanes or blades which act on the air). In other embodiments, air mover 108 may comprise a blower (e.g., centrifugal fan that employs rotating impellers to accelerate air received at its intake and change the direction of the airflow). In these and other embodiments, rotating and other moving components of air mover 108 may be driven by a motor 110. The rotational speed of motor 110 may be controlled by the air mover control signal communicated from air mover control system 106. In operation, air mover 108 may cool information handling resources of information handling system 102 by drawing cool air into an enclosure housing the information handling resources from outside the chassis, expelling warm air from inside the enclosure to the outside of such enclosure, and/or moving air across one or more heatsinks (not explicitly shown) internal to the enclosure to cool one or more information handling resources.

Device 114 may be communicatively coupled to processor 103 and may generally include any information handling resource. In some embodiments, device 114 may include a temperature sensor 112. Temperature sensor 112 may be any system, device, or apparatus (e.g., a thermometer, thermistor, etc.) configured to generate an electrical signal indicative of a sensed temperature within or proximate to device 114. Signals may be received from temperature sensors 112 (e.g., via an Intelligent Platform Management Interface connection) at management controller 116 and may be used to implement various types of cooling strategies by air mover control system 106. Some examples of such cooling strategies are disclosed in U.S. Patent Publication No. 2017/0329651, which is incorporated by reference herein in its entirety.

Management controller 116 may be configured to provide out-of-band management facilities for management of information handling system 102. Such management may be made by management controller 116 even if information handling system 102 is powered off or powered to a standby state. Management controller 116 may include a processor, memory, an out-of-band network interface separate from and physically isolated from an in-band network interface of information handling system 102, and/or other embedded information handling resources. In certain embodiments, management controller 116 may include or may be an integral part of a baseboard management controller (BMC) or a remote access controller (e.g., a Dell Remote Access Controller or Integrated Dell Remote Access Controller). In other embodiments, management controller 116 may include or may be an integral part of a chassis management controller (CMC).

As shown in FIG. 1, management controller 116 may include firmware 118. Firmware 118 may include a program of executable instructions configured to be read and executed by management controller 116 in order to carry out the functionality of management controller 116, including that functionality described herein. For example, firmware 118 may embody an air mover control system 106. Firmware 118 may also include data (e.g., data that need not be executable) such as data records 124. In other embodiments, air mover control system 106 and/or data records 124 may reside on storage media of management controller 116 other than firmware 118 (not shown explicitly).

Air mover control system 106 may include any system, device, or apparatus configured to receive one or more signals indicative of one or more temperatures within information handling system 102 (e.g., one or more signals from one or more temperature sensors 112), receive information regarding thermal parameters of information handling resources (e.g., information from power and/or thermal tables of management controller 116 and/or data records 124) and based on such signals and thermal parameters, calculate an air mover driving signal to maintain an appropriate level of cooling, increase cooling, or decrease cooling, as appropriate, and communicate such air mover driving signal to air mover 108.

In various embodiments, air mover control system 106 may operate air movers 108 in an open-loop or a closed-loop fashion. In some embodiments, air mover control system 106 may operate in a closed-loop fashion under normal circumstances, but may fall back to an open-loop control scheme if temperature sensors are unavailable or have failed. Further, in some embodiments, closed-loop control may be enabled for some but not all information handling resources.

Firmware 118 may also include information regarding cooling strategies in a data structure. A data structure such as a map, list, array, table, or other suitable data structure may include one or more data records 124, each such data record 124 setting forth information regarding a particular cooling strategy and one or more "scaling factors." A data record may be any suitable data type that includes such information (e.g., a row of a table, etc.). One example of a table data structure including rows corresponding to example data records 124 is shown at FIG. 4 and described in more detail below. As noted, the information in data records 124 may be stored in a data structure that is incorporated into a firmware 118 of management controller 116. In other embodiments, the data structure may also be stored elsewhere (e.g., in a computer-readable medium accessible to management controller 116). In these and other embodiments, the data structure may be organized internally as a plurality of separate data structures.

A scaling factor may be used to specify a desired fan speed or a desired amount of airflow, relative to some baseline amount. For example, a scaling factor of 1.00 would indicate that an air mover should be operated at its nominal baseline speed. A scaling factor of 2.00 would indicate that an air mover should be operated at twice its nominal baseline speed (or in other embodiments, operated to produce twice its nominal baseline amount of airflow in cubic feet per minute, linear feet per minute, or any other appropriate measure of airflow).

Scaling factors may be applied to individual air movers, to zones of air movers, to particular modules associated with one or more air movers, or to entire information handling systems in various embodiments.

In addition to processor 103, memory 104, air mover control system 106, air mover 108, temperature sensor 112, device 114, and management controller 116, information handling system 102 may include one or more other information handling resources.

Figure 2A:
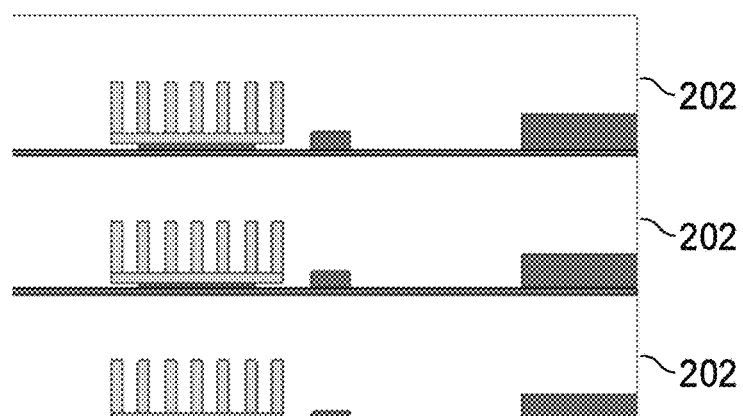
FIGS. 2A-2C illustrate block diagrams of various arrangements of modules having selected airflow impedances.
Figure 2B:
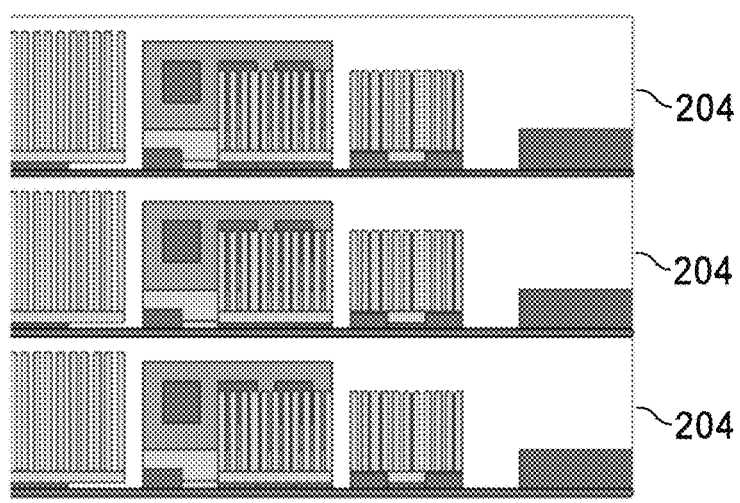
Figure 2C:
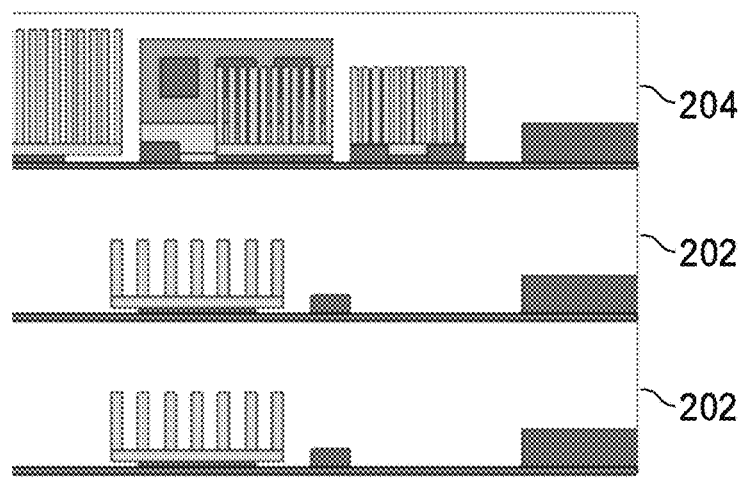

Turning now to FIGS. 2A-2C, some examples of modules having various airflow impedances are shown. Each such module includes one or more information handling resources that impede airflow to a greater or lesser extent. Throughout these embodiments, airflow is assumed to be in the left-to-right direction, and the different modules shown in FIGS. 2A-2C are assumed to share a common airflow path. Modules 202 are shown as having a relatively low airflow impedance based on the information handling resources therein. Modules 204 are shown as having a relatively high airflow impedance based on the information handling resources therein.

In general, it may be useful to characterize the airflow impedance for a module into a particular category (also referred to as a tier). For illustrative purposes, in this disclosure, airflow impedances are described as falling into tier 0 through tier 6, with higher tier numbers corresponding to greater airflow impedances.

One of ordinary skill in the art with the benefit of this disclosure will understand that various intermediate arrangements of information handling resources may also arise in practice, giving rise to an entire continuum of possible airflow impedance numbers. In the cooling strategies described herein, such a continuum may be accounted for by, for example, interpolating between the discrete tier numbers according to a linear or some other type of fit.

In the embodiment of FIG. 2A, all of the modules in the illustrated airflow path are modules 202, having a relatively low airflow impedance (e.g., an airflow impedance that is below a selected low threshold impedance). In the embodiment of FIG. 2B, all of the modules in the illustrated airflow path are modules 204, having a relatively high airflow impedance (e.g., an airflow impedance that is above a selected high threshold impedance). In the embodiment of FIG. 2C, a mixture of modules 202 and modules 204 is present. As described herein, various types of cooling strategies may be appropriate in these and other situations.

Figure 3:
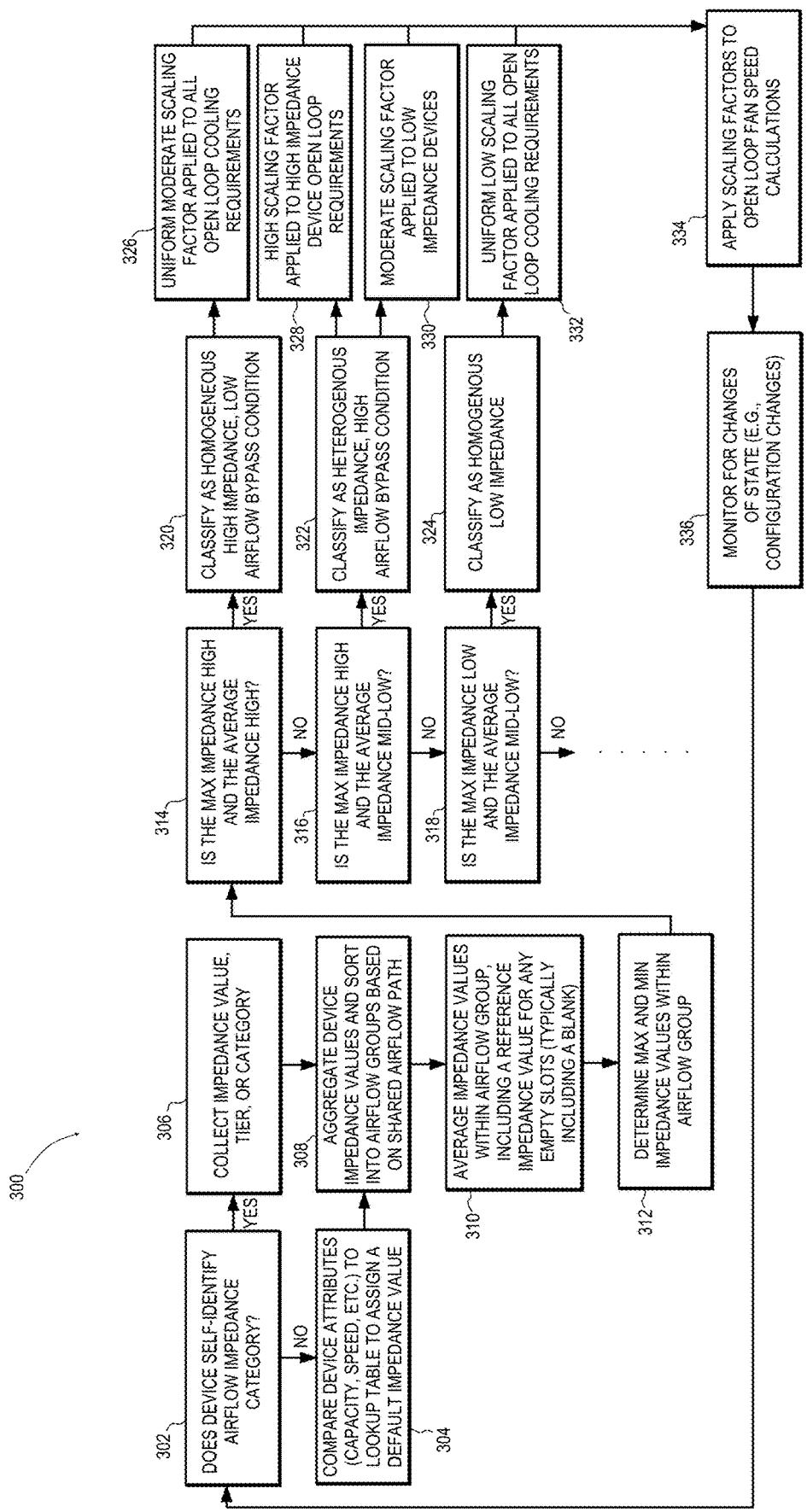
FIG. 3 illustrates a flow chart of an example method, in accordance with embodiments of the present disclosure.

FIG. 3 illustrates a flow chart of an example method 300 for cooling control, in accordance with embodiments of the present disclosure. According to certain embodiments, method 300 may begin at step 302. As noted above, teachings of the present disclosure may be implemented in a variety of configurations of information handling system 102. As such, the preferred initialization point for method 300 and the order of the steps comprising method 300 may depend on the implementation chosen. In these and other embodiments, method 300 may be implemented as hardware, firmware, software, applications, functions, libraries, or other instructions.

Method 300 may be carried out in an information handling system including various devices (also referred to as modules). At step 302, a management controller of the information handling system determines whether the various devices are configured to self-identify their airflow impedance categories/tiers. If so, the management controller collects information regarding the device impedance values, tiers, or categories at step 306. If not, at step 304, the management controller may estimate a default value by comparing attributes of the devices against a lookup table of devices having known values or otherwise infer such a default value based on device attributes. As one example, a storage module having a larger storage capacity may be inferred to have a greater airflow impedance than a storage module having a smaller storage capacity.

Once the impedances have been determined, at step 308 the management controller may aggregate the device impedance values and sort the devices into airflow groups based on shared airflow paths. For example, shared airflow paths may be serial, parallel, or a combination thereof.

At step 310, the management controller may determine the average impedance values for each airflow group. In some embodiments, a reference impedance value may be used for any empty slots (which may or may not include a blank inserted to block airflow escape).

At step 312, the management controller may further determine the maximum and minimum impedance values within each airflow group. Although not specifically pointed out in FIG. 3, additional statistical measures of the impedance values of each airflow group may also be calculated and used in cooling control systems according to the present disclosure. For example, in addition to the average (mean), the median and/or mode may be used. Further, the variance or other statistical moments may in some embodiments be determined and used.

At steps 314, 316, 318, 320, 322, and 324, the airflow groups may be classified based on their respective maximum, minimum, and average impedances. In some embodiments, as noted above, other statistical measures may also be employed.

In particular, if the management controller determines that the maximum impedance and the average impedance are both high at step 314, then the airflow group may be classified as a homogeneous high impedance group with a low amount of airflow bypass at step 320. Then at step 326, all of the air movers for this group may be assigned a uniform scaling factor of moderate magnitude.

If, instead, the management controller determines that the maximum impedance is low and the average impedance is mid-to-low at step 318, then the airflow group may be classified as a homogeneous low impedance group with a low amount of airflow bypass at step 324. Then at step 332, all of the air movers for this group may be assigned a uniform scaling factor of relatively low magnitude.

If, instead, the management controller determines that the maximum impedance is high and the average impedance is mid-to-low at step 316, then the airflow group may be classified as a heterogeneous group with a high amount of airflow bypass at step 322. Then at step 328, the air movers corresponding to high impedance devices in this group may be assigned a high scaling factor. Further, at step 330, the air movers corresponding to low impedance devices in this group may be assigned a moderate scaling factor, which may help to mitigate the airflow bypass issues inherent in a heterogeneous airflow group.

As indicated below step 318, if none of the determinations of steps 314, 316, and 318 are a good match for the device, then the management controller may check other possibilities. If the management controller is unable to find a good match (e.g., if the device has a particularly extreme spread of impedances, or if the device's category cannot be accurately determined), then in some embodiments a default control strategy determination may be used (e.g., the device may finally be tested against a data record 124 that is configured to match any device).

At step 334, the various assigned scaling factors may be applied to the respective air movers, and the air movers may be operated in an open-loop fashion according to their scaling factors. At step 336, the management controller may monitor the system for changes of state (e.g., configuration changes or the like). In the event of a state change, the method may proceed back to step 302.

Although FIG. 3 discloses a particular number of steps to be taken with respect to method 300, method 300 may be executed with greater or fewer steps than those depicted in FIG. 3. In addition, although FIG. 3 discloses a certain order of steps to be taken with respect to method 300, the steps comprising method 300 may be completed in any suitable order.

Method 300 may be implemented using any of the various components disclosed herein (such as the components of FIG. 1), and/or any other system operable to implement method 300. In certain embodiments, method 300 may be implemented partially or fully in software and/or firmware embodied in computer-readable media.

Turning now to FIG. 4, an example table data structure is shown, providing a particular implementation of cooling strategies in accordance with this disclosure. FIG. 4 illustrates an embodiment in which two types of modules are present in an information handling system: Module Type A and Module Type B. In this example, Module B is of a smaller form factor, and so its scaling factors may (as discussed below) be higher to ensure sufficient cooling airflow.

Each row of the example table may correspond to a particular data record 124. A particular airflow group may be tested against each row of the table to determine what the best match is, in order to determine an appropriate cooling strategy.

For example, index 2 corresponds to all of the instances of Module A in an airflow group being tier 0 (the lowest impedance tier). In that situation, the average, highest, and lowest impedances in the group will all be equal to 0. The scaling factor applied to Modules A is equal to 0.91, slightly below the default nominal scaling factor of 1.0. The scaling factor applied to Modules B is 3.26. Indices 3-8 are similar to index 2, in that they correspond to all instances of Module A in the airflow group being of a single impedance tier.

As another example, index 10 corresponds to all instances of Module A in an airflow group being in the medium range of tier 3-4. The scaling factor applied to Modules A that are in tier 3 is equal to 1.23, and the scaling factor applied to Modules A that are in tier 4 is 1.41. The scaling factor applied to Modules B is 2.80.

Finally, as noted above, in some instances an airflow group will not correspond well to any of the predefined situations in indices 2-11. In such a situation, the airflow group may be matched against index 1, which may be implemented as a default index that matches any airflow group. Thus a default cooling strategy may be implemented as a fallback.

One of ordinary skill in the art with the benefit of this disclosure will understand that in any particular implementation, different values may be chosen for the various scaling factors as appropriate. Thus the particular numbers shown in FIG. 4 should be understood as providing a particular example, for the sake of explanation. One of ordinary skill in the art with the benefit of this disclosure will further understand how the table of FIG. 4 may be generalized to encompass information handling systems with additional module types, etc.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An information handling system comprising:
a processor;
a memory communicatively coupled to the processor;
a plurality of modules installed in the information handling system, wherein each module includes one or more information handling resources, and wherein each module has a corresponding airflow impedance associated therewith; and
a cooling system comprising a controller and a plurality of air movers;
wherein the controller is configured to, in response to a determination that a first module of the plurality of modules has a first airflow impedance higher than an upper threshold impedance, that a second module of the plurality of modules has a second airflow impedance lower than a lower threshold impedance, and that the first and second modules are both disposed within a single airflow path:
determine a scaling factor based on the first and second airflow impedances, wherein the scaling factor is usable by the controller to adjust an amount of airflow provided by the plurality of air movers; and
control the plurality of air movers in an open-loop fashion according to the scaling factor.

2. The information handling system of claim 1, wherein at least one of the modules includes physical storage resources.

3. The information handling system of claim 1, wherein the controller is a management controller of the information handling system.

4. The information handling system of claim 1, wherein the scaling factor is further based on statistics of the airflow impedances of all of the modules.

5. The information handling system of claim 1, wherein determining the scaling factor includes determining a first scaling factor for a first subset of the modules and a second scaling factor for a second subset of the modules.

6. The information handling system of claim 1, wherein the controller is configured to control the plurality of air movers in an open-loop fashion responsive to a failure of at least one temperature sensor.

7. The information handling system of claim 1, wherein the controller is configured to receive airflow impedance information from the modules.

8. A method comprising:
at an information handling system that includes a plurality of modules installed therein, each module including one or more information handling resources, and each module having a corresponding airflow impedance associated therewith, a controller of a cooling system determining that a first module has a first airflow impedance higher than an upper threshold impedance, that a second module has a second airflow impedance lower than a lower threshold impedance, and that the first and second modules are both disposed within a single airflow path;
the controller determining a scaling factor based on the first and second airflow impedances, wherein the scaling factor is usable by the controller to adjust an amount of airflow provided by a plurality of air movers; and
the controller controlling the plurality of air movers in an open-loop fashion according to the scaling factor.

9. The method of claim 8, wherein the scaling factor is applied to fan speed percentages of the plurality of air movers.

10. The method of claim 8, wherein the scaling factor is applied to a desired flow rate of air.

11. The method of claim 8, wherein the controller determining the first and second airflow impedances comprises the controller receiving information regarding impedance from the modules.

12. The method of claim 8, wherein determining the scaling factor includes determining a first scaling factor for a first subset of the modules and a second scaling factor for a second subset of the modules.

13. The method of claim 12, wherein the controlling the plurality of air movers in an open-loop fashion according to the scaling factor includes:
controlling an air mover associated with the first subset according to the first scaling factor; and
controlling an air mover associated with the second subset according to the second scaling factor.

14. An article of manufacture comprising a non-transitory, computer-readable medium having instructions thereon that are executable by a controller of a cooling system of an information handling system for:
determining that a first module of the information handling system has a first airflow impedance higher than an upper threshold impedance, that a second module of the information handling system has a second airflow impedance lower than a lower threshold impedance, and that the first and second modules are both disposed within a single airflow path;
determining a scaling factor based on the first and second airflow impedances, wherein the scaling factor is usable to adjust an amount of airflow provided by a plurality of air movers of the information handling system; and
controlling the plurality of air movers in an open-loop fashion according to the scaling factor.

15. The article of claim 14, wherein the first module includes physical storage resources.

16. The article of claim 14, wherein the controller of the cooling system is a chassis management controller.

17. The article of claim 14, wherein the scaling factor is further determined based on statistical measures of airflow impedances of other modules of the information handling system.

18. The article of claim 14, wherein determining the scaling factor includes determining at least a first scaling factor and a second scaling factor.

19. The article of claim 18, wherein the information handling system includes a plurality of other modules.

20. The article of claim 19, wherein the instructions are further for controlling an air mover associated with a first subset of the plurality of other modules according to the first scaling factor, and controlling an air mover associated with a second subset of the plurality of other modules according to the second scaling factor.

* * * * *